(12) United States Patent
Odaka

(10) Patent No.: US 10,739,887 B2
(45) Date of Patent: Aug. 11, 2020

(54) DISPLAY DEVICE WITH TOUCH SENSOR

(71) Applicant: Japan Display Inc., Tokyo (JP)

(72) Inventor: Kazuhiro Odaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 274 days.

(21) Appl. No.: 15/785,587

(22) Filed: Oct. 17, 2017

(65) Prior Publication Data
US 2018/0120989 A1    May 3, 2018

(30) Foreign Application Priority Data

Nov. 1, 2016  (JP) .................................. 2016-214559

(51) Int. Cl.
| | | |
|---|---|---|
| *G06F 3/041* | (2006.01) | |
| *G06F 3/044* | (2006.01) | |
| *H01L 27/12* | (2006.01) | |
| *H01L 27/32* | (2006.01) | |

(52) U.S. Cl.
CPC ............ *G06F 3/0412* (2013.01); *G06F 3/044* (2013.01); *H01L 27/124* (2013.01); *G06F 2203/04102* (2013.01); *G06F 2203/04103* (2013.01); *H01L 27/323* (2013.01)

(58) Field of Classification Search
CPC .................... G06F 3/0412; G06F 21/32; G06F 2203/0338; G06K 9/0002
See application file for complete search history.

(56) References Cited

U.S. PATENT DOCUMENTS

| | | | | |
|---|---|---|---|---|
| 2010/0085326 A1* | 4/2010 | Anno | ...................... | G06F 3/044 345/174 |
| 2013/0293096 A1* | 11/2013 | Kang | .................... | G06F 1/1652 313/511 |
| 2014/0069692 A1* | 3/2014 | Park | ........................ | G06F 3/041 174/250 |
| 2015/0035761 A1* | 2/2015 | Seo | ........................ | G06F 3/044 345/173 |
| 2017/0309646 A1* | 10/2017 | Son | ..................... | G06F 3/03547 |

FOREIGN PATENT DOCUMENTS

JP            2008-197757 A          8/2008

* cited by examiner

*Primary Examiner* — Temesghen Ghebretinsae
*Assistant Examiner* — Paras D Karki
(74) *Attorney, Agent, or Firm* — Michael Best & Friedrich LLP

(57) ABSTRACT

A display device includes a substrate including a display region arranged with pixels, and a terminal part on the outside of the display region, a polarizer overlapping the display region and the terminal part, the polarizer arranged with first wirings, a retardation plate overlapping the display region and the terminal part, the retardation plate between the pixels and the polarizer, and second wirings arranged in a direction intersecting the direction the first wirings is arranged, wherein an interval the first wirings is arranged is narrower than an interval the second wirings is arranged, the first wirings and the second wirings are arranged sandwiching a dielectric body, the first wirings and the second wirings are connected to a lead-out line, and an end of the retardation plate at the terminal part is closer to the display region than an end of the polarizer.

18 Claims, 19 Drawing Sheets

DISPLAY DEVICE WITH TOUCH SENSOR

CROSS REFERENCE TO RELATED APPLICATIONS

This application is based upon and claims the benefit of priority from the prior Japanese Patent Application No. 2016-214559, filed on Nov. 1, 2016, the entire contents of which are incorporated herein by reference.

FIELD

The present invention is related to a display device using a flexible substrate capable of bending.

BACKGROUND

A liquid crystal display device utilizing the electro-optical effects of liquid crystals and organic EL display devices using organic electroluminescence (organic EL) devices have been developed practically used as display devices used in electric appliances and electronic devices. In addition, a touch panel, which is a display device in which a touch sensor is mounted on a display region, has been rapidly spreading. Touch panels are especially required for mobile information terminals including smartphones.

As a method of arranging a touch sensor electrode (transmission electrode, reception electrode) in an organic EL display device, there is a method of attaching a separately manufactured touch sensor or a method of forming a touch sensor electrode on a display region. For example, Japanese Patent Laid Open Patent Publication No. 2008-197757 discloses the use of a wire grid arranged on a polarizer as a touch sensor electrode.

SUMMARY

According to one embodiment of the present invention, a display device includes a substrate including a display region arranged with a plurality of pixels, and a terminal part located on an outer side of the display region, a polarizer overlapping the display region and a part of the terminal part in a planar view, the polarizer arranged with a plurality of first wirings, a retardation plate overlapping the display region and a part of the terminal part in a planar view, the retardation plate being located between the plurality of pixels and the polarizer, and a plurality of second wirings arranged in a direction intersecting the direction in which the plurality of first wirings is arranged. An interval where the plurality of first wirings is arranged is narrower than an interval where the plurality of second wirings is arranged, the plurality of first wirings and the plurality of second wirings are arranged sandwiching a dielectric body, the first wirings and the second wirings are each connected to a lead-out line respectively, and an end part of the retardation plate located at the terminal part is located closer to a side of the display region than an end part of the polarizer located at the terminal part.

According to one embodiment of the present invention, a display device includes a substrate including a display region arranged with a plurality of pixels, and a terminal part located on an outer side of the display region, a first adhesive layer having translucency located above the display region and a part of the terminal part, a terminal electrode arranged in a region of the terminal part where the first adhesive layer is not located, a polarizer overlapping the display region and a part of the terminal part in a planar view, the polarizer arranged with a plurality of first wirings, and a retardation plate overlapping the display region and a part of the terminal part in a planar view, the retardation plate being located between the plurality of pixels and the polarizer, and arranged with a plurality of second wirings arranged in a direction intersecting the direction in which the plurality of first wirings is arranged. The retardation plate includes a first lead-out line connected to the plurality of second wirings, a second lead-out line opposing the first lead-out line, a first connection line connecting the first lead-out line and the second lead-out line. A second adhesive layer includes translucency arranged in a part above the retardation plate. A third adhesive layer includes a first conductive particle and arranged in a region where the second adhesive layer is not located above the first lead-out line. A fourth adhesive layer includes a second conductive particle and arranged above the terminal electrode. The polarizer is located above the second adhesive layer and the third adhesive layer, and includes a third lead-out line and a second connection line connecting the plurality of first wirings and the third lead-out line. The terminal electrode and the third lead-out line are connected via the second conductive particle, the second lead-out line, the second connection line, the first lead-out line and the first conductive particle.

DESCRIPTION OF EMBODIMENTS

Figure 1:
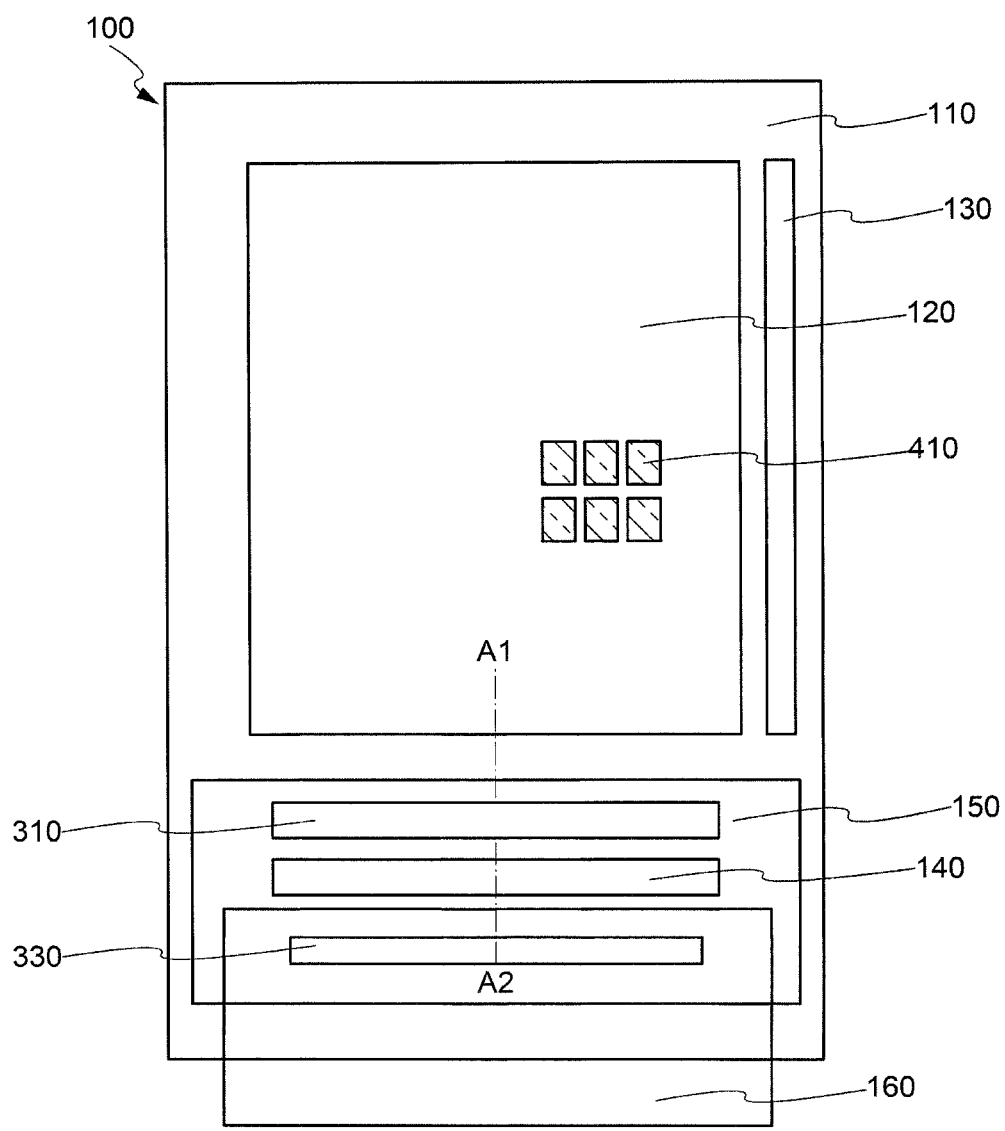
FIG. 1 is an upper surface view diagram of a display device related to one embodiment of the present invention.

Hereinafter, embodiments according to the present invention will be described with reference to the drawings. This disclosure merely provides an example, and modifications or alterations thereof readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clearer illustration. The drawings are merely examples and do not limit the interpretations of the present invention in any way.

In the specification and the drawings, components that have substantially the same functions as those described before with reference to a previous drawing(s) bear the identical reference signs thereto, and detailed descriptions thereof may be omitted. The words "first", "second" or the like provided for components are used merely to distinguish the components from each other, and do not have any further meaning unless otherwise specified.

In the specification and the claims, an expression that a component or a region is "on" another component or region encompasses a case where such a component or region is in direct contact with the another component or region and also a case where such a component is above or below the another component or region, namely, a case where still another component or region is provided between such a component or region and the another component or region, unless otherwise specified. In the following description, unless otherwise specified, the side on which a display element is provided with respect to a first substrate as seen in a cross-sectional view will be referred to as "above" or "front surface", and the opposite side will be referred to as "below" or "rear surface".

First Embodiment

In the case when a signal obtained by a touch sensor is sent to a control circuit, a connection between the touch sensor and a flexible printed substrate is necessary. As a result, a flexible printed substrate for a display region and a flexible printed substrate for the touch sensor are required.

1-1. Structure of Display Device

FIG. 1 shows an upper surface view diagram of a display device 100 according to an embodiment of the present invention. As is shown in FIG. 1, the display device 100 includes a substrate 110, a display region 120, a drive circuit 130, a drive circuit 140, a terminal part 150, a flexible printed substrate 160 and a terminal electrode 330.

A plurality of pixels 410 are arranged in an array in the display region 120. In the case of an active matrix, each pixel 410 is arranged with a thin film transistor and a display element. The thin film transistor drives the display element based on an external signal transmitted via the flexible printed substrate 160 or a signal transmitted from the drive circuit 130 and the drive circuit 140. In this way, a still image or a moving image is displayed in the display region 120. An organic EL element is used for the display element for example. Furthermore, the display region 120, the drive circuit 140, the terminal part 150 and the flexible printed substrate 160 are connected using wirings arranged on the substrate 110.

The drive circuit 130 has a function of a drive circuit (gate driver) for driving a scanning line. The drive circuit 140 has a function of a drive circuit (source driver) for driving a signal line. The drive circuit 130 and the drive circuit 140 are formed by an integrated circuit such as an ASIC (Application Specific Integrated Circuit).

The terminal part 150 has wirings for connecting the display region 120, the drive circuit 140 and the flexible printed substrate 160. The terminal part 150 is located on the outer side of the display region 120. The drive circuit 140, the terminal electrode 310, and the terminal electrode 330 may be arranged above the terminal part 150 or may be arranged within the terminal part 150.

The flexible printed substrate 160 can receive a signal from an external circuit and transmit the signal to the drive circuit 140 and the display region 120 via the terminal electrode 330. A plurality of wirings are arranged on a resin substrate having flexibility on the flexible printed substrate 160. Furthermore, the drive circuit 140 may also be arranged on the flexible printed substrate 160.

Figure 2:
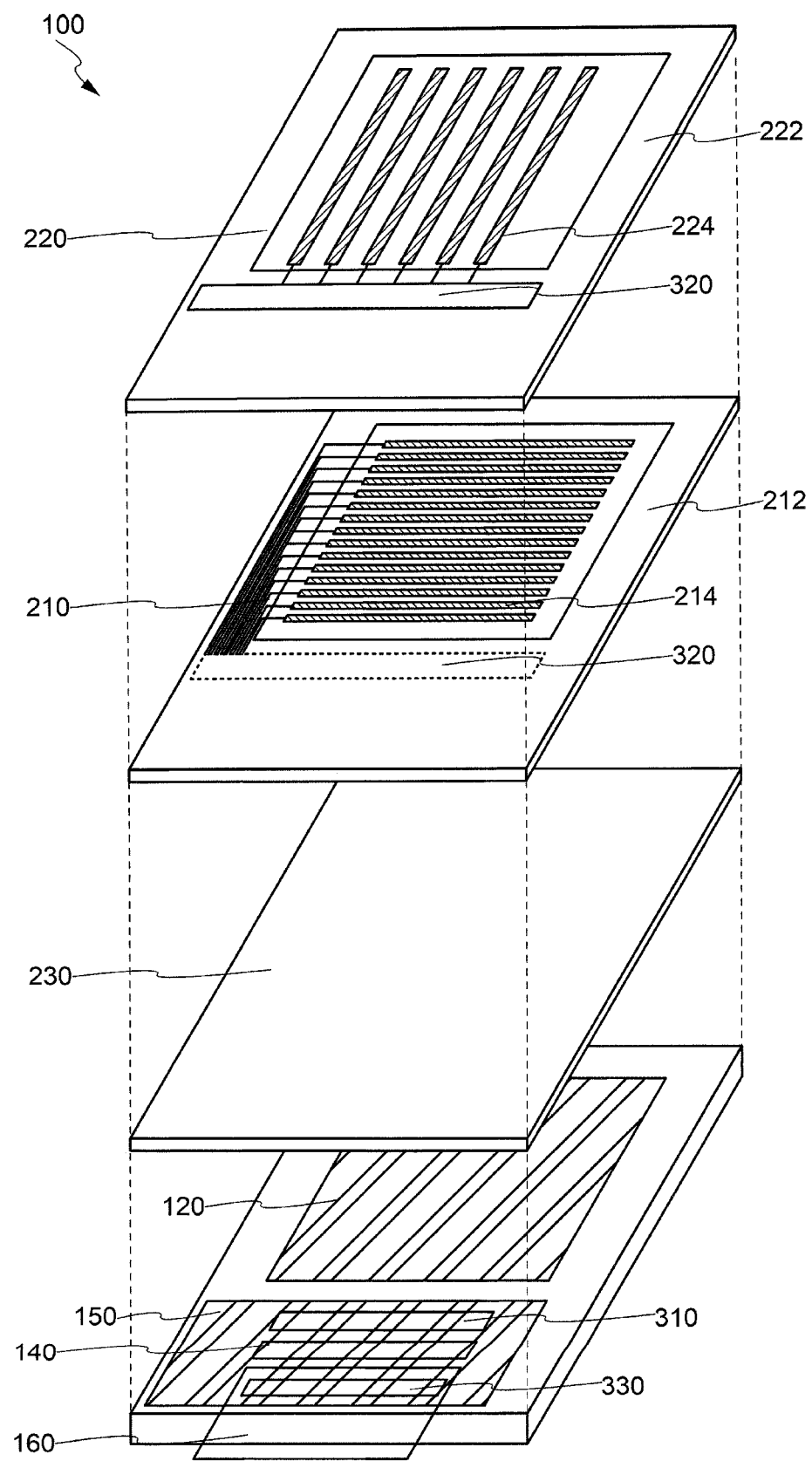
FIG. 2 is a perspective view diagram of a display device related to one embodiment of the present invention.

A perspective view of the display device 100 is shown in FIG. 2. As is shown in FIG. 2, the display device 100 includes a polarizer 210 (also referred to as a polarizing plate) overlapping the display region 120 and arranged with a plurality of first wirings 214 having conductivity arranged in parallel at equal intervals, a polarizer 220 arranged with a plurality of second wirings 224 having conductivity arranged at predetermined intervals in a direction intersecting a direction in which the plurality of first wirings 214 are arranged, and a retardation plate 230. When viewed in a planar view, the polarizer 210 is arranged to overlap the display region 120. Similarly, when viewed in a planar view, the retardation plate 230 is arranged to overlap the display region 120 and a part of the terminal part 150. The interval at which the plurality of first wirings 214 are arranged is narrower than the interval at which the plurality of second wirings 224 are arranged. Therefore, the polarizer 220 does not interfere with the function of the polarizer 210. In addition, the plurality of first wirings 214 and the plurality of second wirings 224 are arranged with a dielectric (for example, an insulating layer 265 described later) sandwiched therebetween. The first wirings 214 and the second wirings 224 are connected to a lead-out line 320, respectively.

Figure 3:
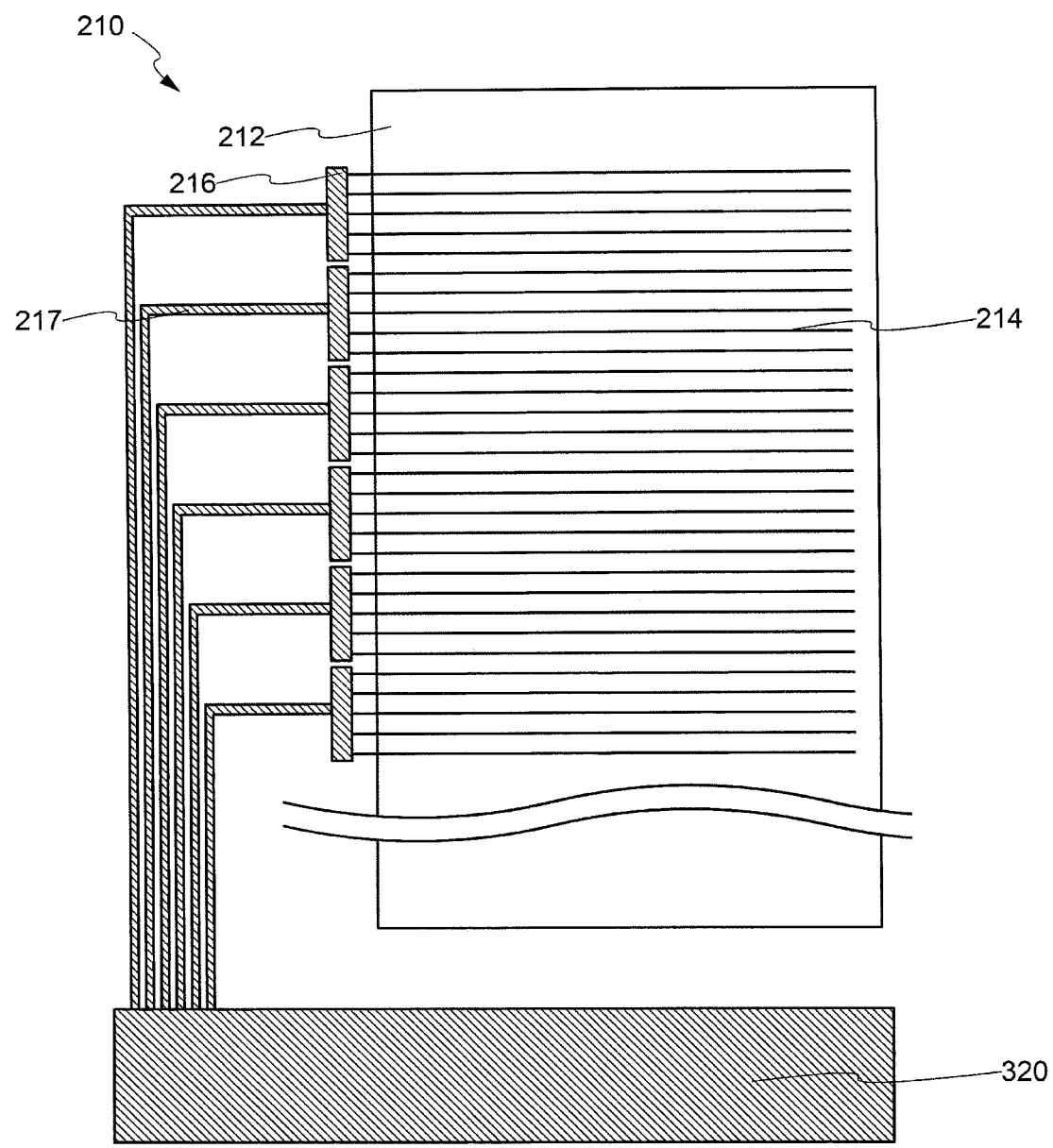
FIG. 3 is an upper surface view diagram of a polarizer related to one embodiment of the present invention.

In the display device 100, electrostatic capacitance between the first wirings 214 and the second wirings 224 is detected. At this time, one of the first wirings 214 and the second wirings 224 may be a transmitting electrode and the other may be a receiving electrode. In addition, as is shown in FIG. 3, the plurality of first wirings 214 are electrically connected at the ends through a connection part 216 for each of the plurality of first wirings 214. They are further electrically connected to a lead-out line 320 via wiring (routing wirings 217) which is electrically connected to the plurality of first wirings 214 at the connection part 216. In addition, the first wirings 214 and the second wirings 224 may include aluminum or silver which are highly conductive materials. In addition, the width of the first wirings 214 and the width of the second wirings 224 may be 10 nm or more and less than 1 μm. Since the first wirings 214 and the second wirings 224 are extremely fine wires, still images or moving images displayed from the display region are hardly affected when viewed. Due to the structure described above, the first wirings 214 and the second wirings 224 not only have polarization but also have a function as electrodes of a touch sensor in the display device 100.

1-2. Cross-Sectional Structure of Display Device

Figure 4:
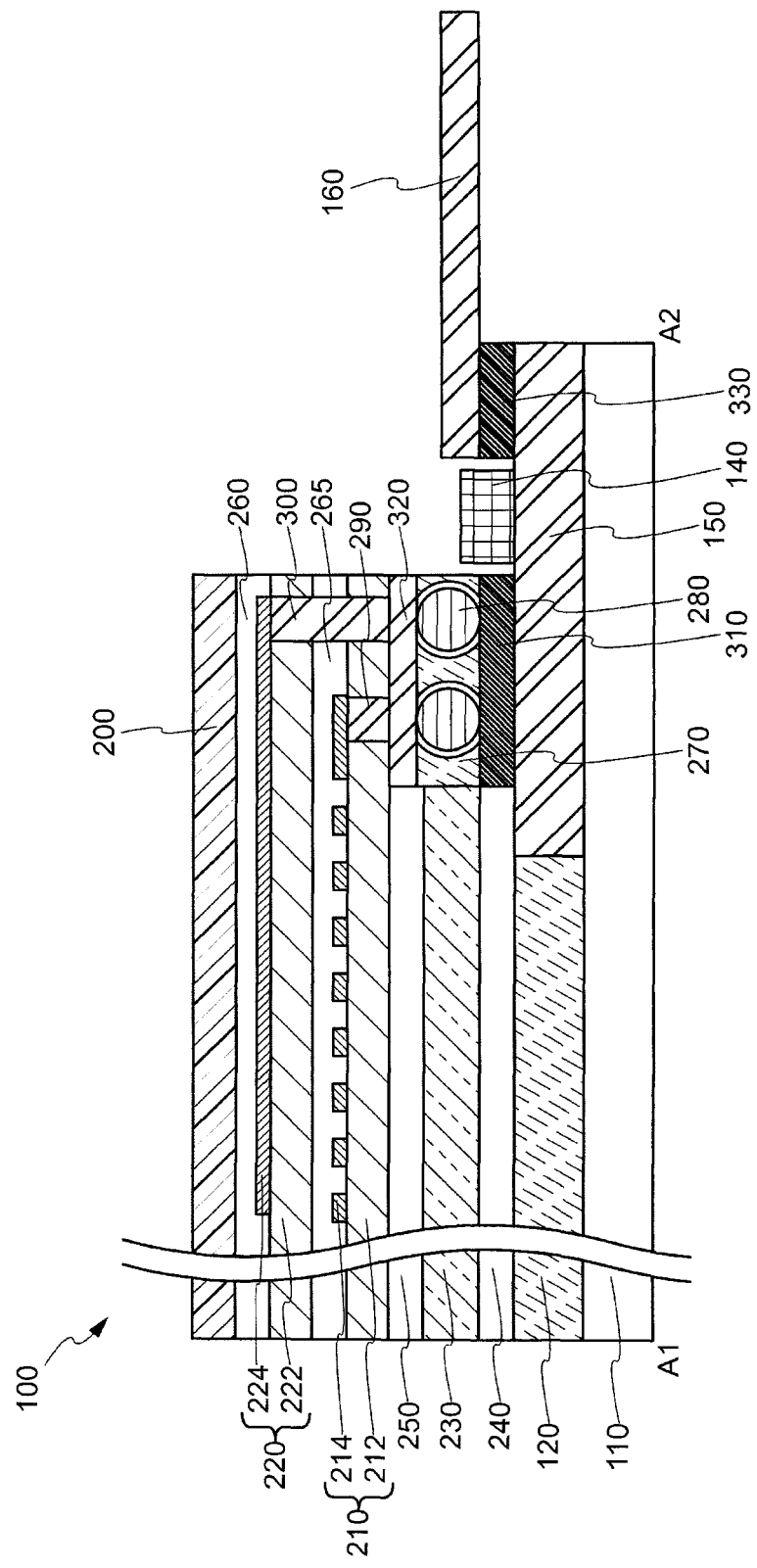
FIG. 4 is a cross-sectional view diagram of a display device related to one embodiment of the present invention.

Next, a cross-sectional structure of the display device 100 is shown. FIG. 4 shows a cross-sectional view between A1-A2 of the display device 100 shown in FIG. 1. The display device 100 includes a substrate 110 having a display region 120 and a terminal part 150, an adhesive layer 240, a terminal electrode 310, a retardation plate 230, an adhesive layer 250, a polarizer 210, an adhesive layer 265, a polarizer 220, connection line 290, connection line 300, an adhesive layer 260, a protective member 200, a lead-out line 320, an adhesive layer 270, a drive circuit 140, a terminal electrode 330 and a flexible printed substrate 160.

The adhesive layer 240 is arranged above the display region 120 and above a part of the terminal part 150. The adhesive layer 240 is optically transparent. The adhesive layer 240 may be formed from a solidified liquid or it may be in the form of a film. An organic resin material such as acrylic, silicone, urethane or the like is used for the adhesive layer 240. For example, the adhesive layer 240 may have thermosetting properties.

The terminal electrode 310 is arranged above the terminal part 150 and is arranged further to the outer side than an end part of the adhesive layer 240. In other words, the terminal electrode 310 is arranged in a region where the adhesive layer 240 is not located. A conductive material is used as the terminal electrode 310. For example, copper (Cu) is used for the terminal electrode 310.

The retardation plate 230 is arranged above the adhesive layer 240. The retardation plate 230 has a function of converting incident linearly polarized light into circularly polarized light. Therefore, the polarizer 210 and the retardation plate 230 may be collectively referred to as a circularly polarizing plate. The retardation plate 230 may be in the form of a film. For example, an organic resin such as polyimide is used for the retardation plate 230. As is shown in FIG. 4, in the present embodiment, an end part of the retardation plate 230 located at the terminal part 150 is located closer to the display region 120 side than an end part of the polarizer 220 located at the terminal part 150. That is, a region exists in which the retardation plate 230 and the polarizer 220 do not overlap in a planar view, and a connection between the terminal electrode 310 and the first wirings 214 and a connection between the terminal electrode 310 and the second wirings 224 described herein can be performed in this region.

The adhesive layer 250 is arranged on the retardation plate 230. The same material as the adhesive layer 240 is used for the adhesive layer 250.

The polarizer 210 is arranged above the adhesive layer 250. The polarizer 210 includes a base 212, first wirings 214, a lead-out line 320, and a connection line 290 connecting the first wirings 214 and the lead-out line 320. A film is used as the base 212. The thickness of the base 212 may be 10 μm or more and less than 200 μm. The polarizer 210 has a function for linearly polarizing light incident from the exterior.

The adhesive layer 265 is arranged above the polarizer 220. Similar to the adhesive layer 240 and the adhesive layer 250, the adhesive layer 265 has a translucency.

The polarizer 220 is arranged above the adhesive layer 265 and is arranged with a base 222 and second wirings 224. Furthermore, the polarizer 220 does not necessarily have to have polarization properties.

The first wirings 214 and the lead-out line 320 are connected by a connection line 290. In addition, the second wirings 224 and the lead-out line 320 are connected by a connection line 300. For example, copper (Cu) is used for the connection line 290 and the connection line 300.

A film-shaped wire or a solid wire is used as the lead-out line 320. Copper (Cu) is used for the lead-out line 320.

The adhesive layer 270 is arranged above the terminal electrode 310. The adhesive layer 270 is arranged further to the outer side than the end part of the adhesive layer 250 similar to the terminal electrode 310. The adhesive layer 270 also includes conductive particles 280.

The conductive particles 280 have an insulating layer on the periphery part of a core part having conductivity. Although the conductive particles 280 usually do not have conductivity, they have anisotropic conductivity due to an external load such as being crimped. For example, the terminal electrode 310 and the lead-out line 320 are connected via the conductive particles 280.

An adhesive layer 260 and protective member 200 are arranged above the polarizer 220. The adhesive layer 260 is made of the same material as the adhesive layer 240, the adhesive layer 250 and the adhesive layer 265. The protective member 200 has a function of protecting the surface side of the display device 100. The protective member 200 has translucency. A glass substrate may be used or a resin substrate of polyimide, acrylic or the like may be used as the protective member 200. In addition, the protective member 200 may be in the form of a film.

1-3. Manufacturing Method of Display Device

Next, a manufacturing method of the display device 100 is explained using FIG. 5 to FIG. 11.

Figure 5:
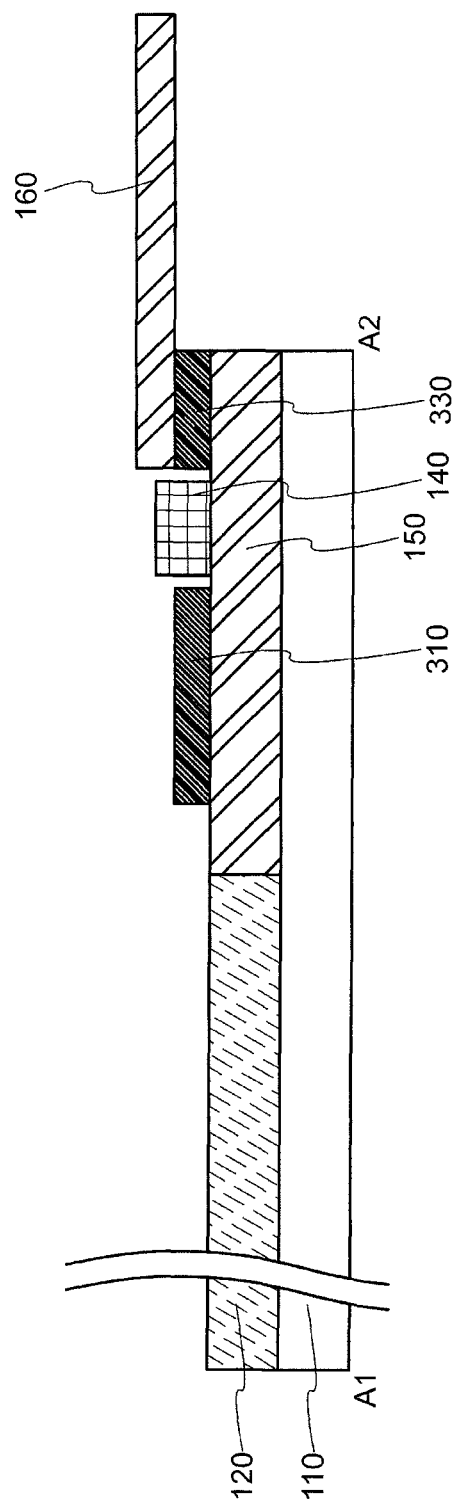
FIG. 5 is a cross-sectional diagram showing a manufacturing method of a display device related to one embodiment of the present invention.

As is shown in FIG. 5, first a display region 120 and a terminal part 150 are formed above a substrate 110. In addition, the terminal electrode 310, the drive circuit 140, and the terminal electrode 330 are formed above the terminal part 150. A transistor, a display element and a sealing layer are formed in the display region 120. The drive circuit 140 may be arranged within the terminal part 150 or may be separately formed and connected to the terminal part 150. The terminal electrode 330 and the flexible printed substrate 160 may be connected by crimping or may be connected using conductive particles.

Figure 6:
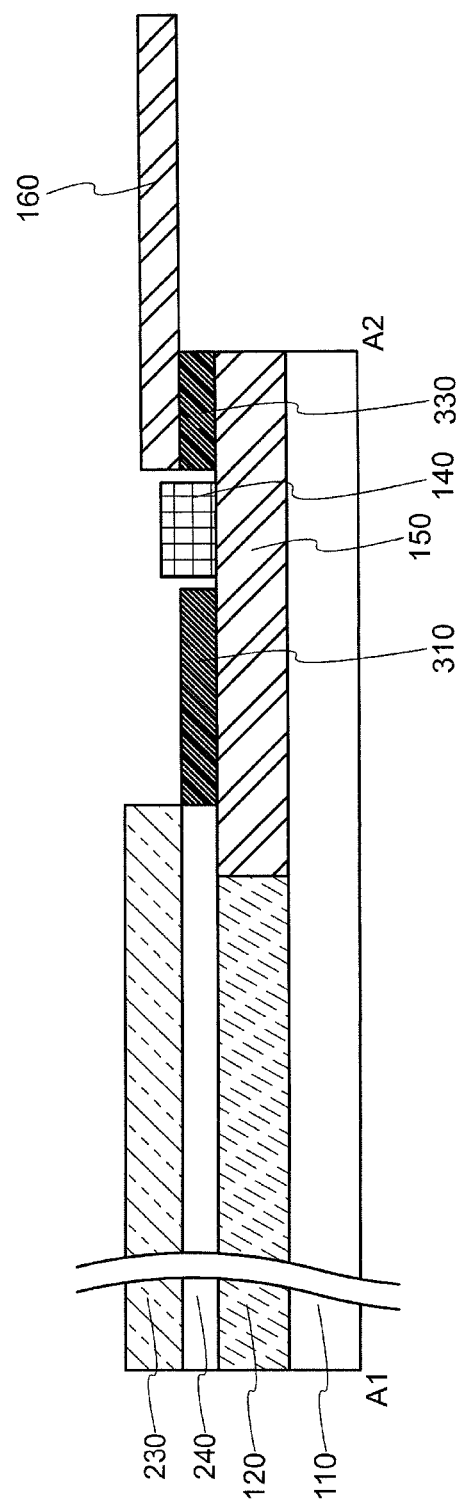
FIG. 6 is a cross-sectional diagram showing a manufacturing method of a display device related to one embodiment of the present invention.

Next, as is shown in FIG. 6, a retardation plate 230 is formed above the display region 120 and the terminal part 150 using the adhesive layer 240. A film-shaped organic resin is used, for example, a cycloolefin polymer is used as the retardation plate 230. An organic resin having translucency is used for the adhesive layer 240. The adhesive layer 240 is cured by heat or irradiation with light in the ultraviolet region, and the display region 120 and the terminal part 150 are adhered to the retardation plate 230. Furthermore, the adhesive layer 240 and the retardation plate 230 are arranged so that the terminal electrode 310 is located further to the outer side than the end parts of the adhesive layer 240 and the retardation plate 230.

Figure 7:
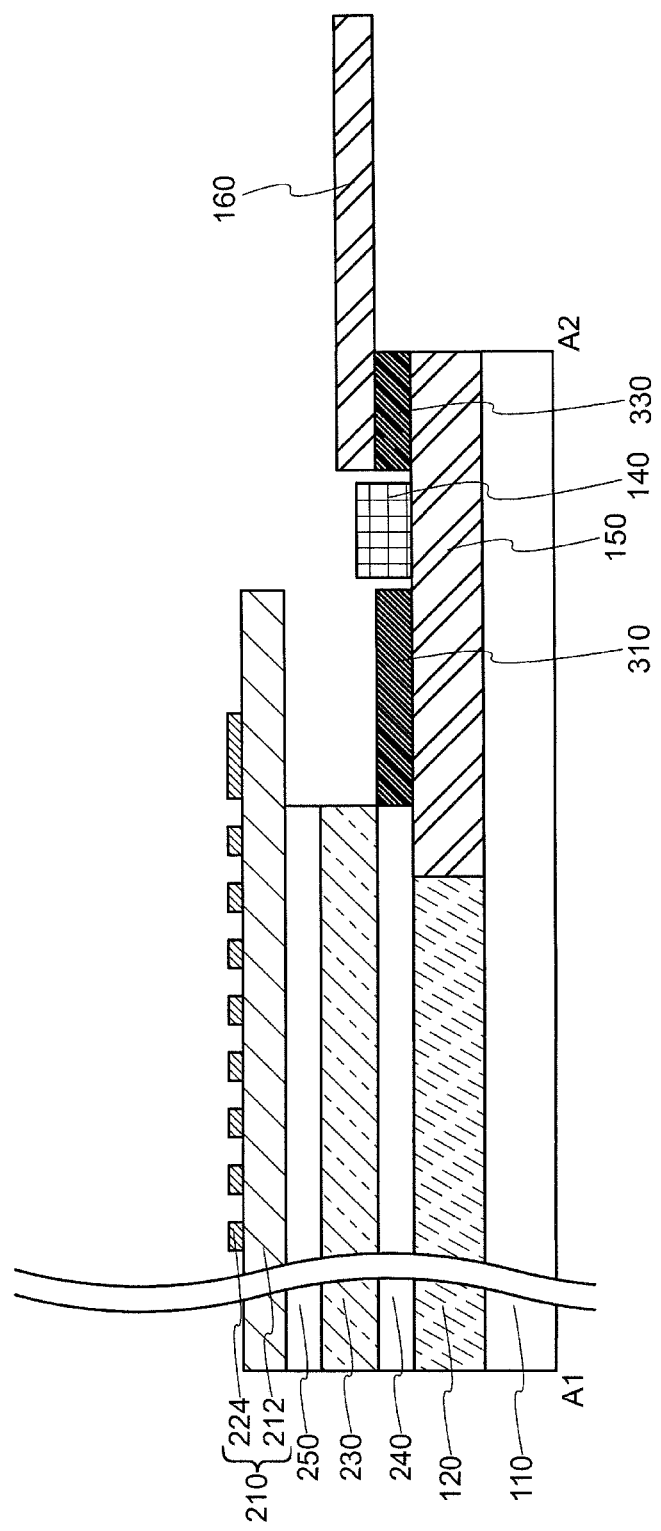
FIG. 7 is a cross-sectional diagram showing a manufacturing method of a display device related to one embodiment of the present invention.

Next, as is shown in FIG. 7, the polarizer 210 formed with the first wirings 214 above the retardation plate 230 is formed using the adhesive layer 250. Aluminum (Al) or silver (Ag) is used as a conductive film for the first wirings 214. The first wirings 214 may be processed by an etching method after forming the conductive film or may be formed by a printing method. The same method as the adhesive layer 240 is used as the bonding method. Furthermore, the first wirings 214 of the polarizer 210 may be formed before the polarizer 210 is adhered or may be formed after adhering.

Figure 8:
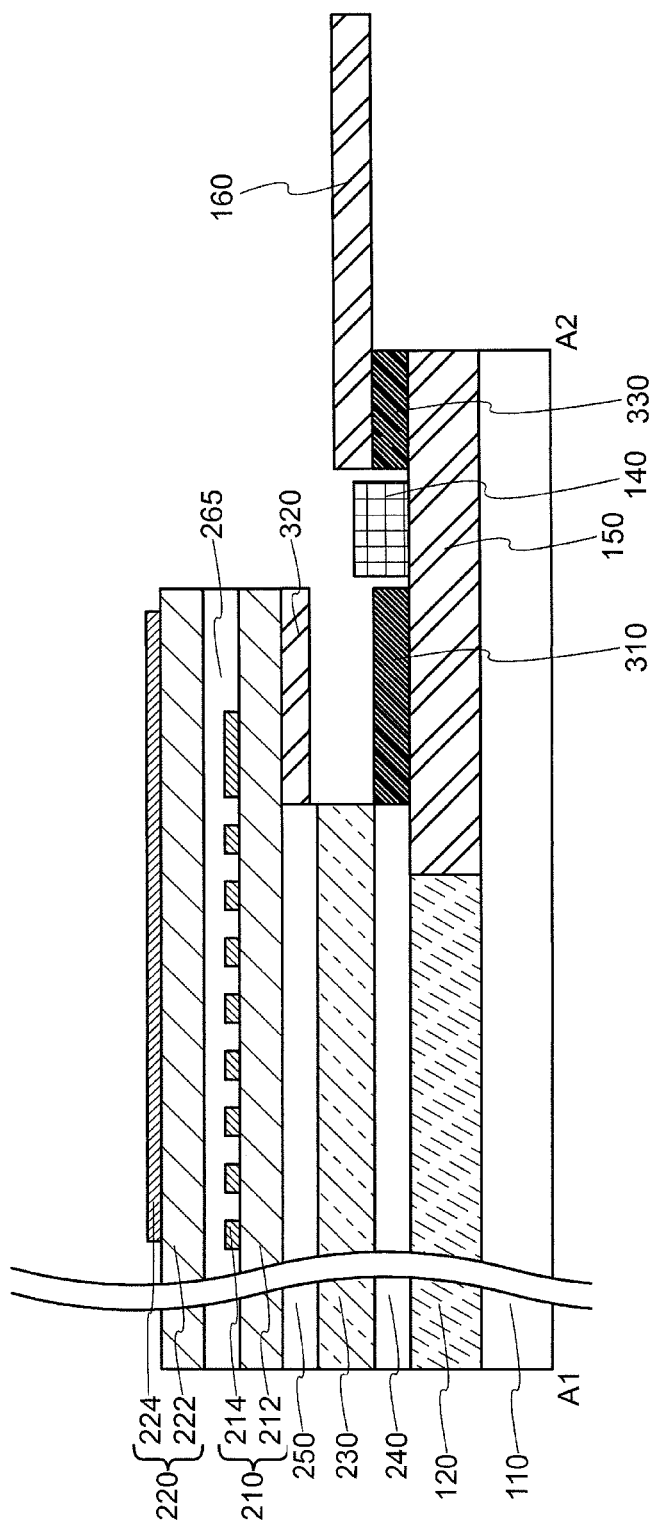
FIG. 8 is a cross-sectional diagram showing a manufacturing method of a display device related to one embodiment of the present invention.

Next, as is shown in FIG. 8, a polarizer 220 is formed above the polarizer 210 using an adhesive layer 265. The same method as in the case of using the adhesive layer 240 is used as the adhesion method. Similar to the first wirings 214, the second wirings 224 may be formed before the polarizer 210 is adhered or may be formed after adhering. In addition, the second wirings 224 may be formed by the same method as the first wirings 214.

Figure 9:
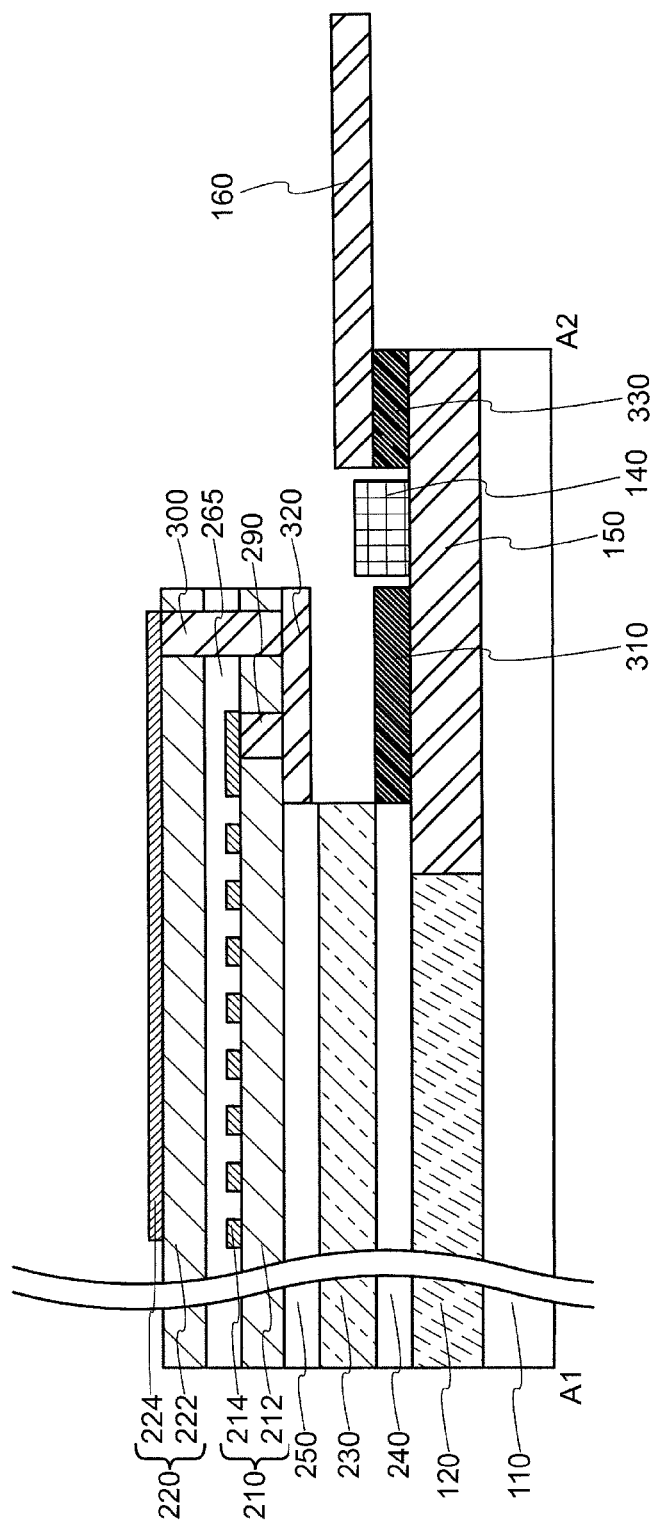
FIG. 9 is a cross-sectional diagram showing a manufacturing method of a display device related to one embodiment of the present invention.

Next, as is shown in FIG. 9, connection line 290, connection line 300, and lead-out line 320 are formed. The connection line 290 is formed in an opening part arranged so as to pass through the polarizer 220. The connection line 300 is formed in an opening part arranged so as to pass through the polarizer 220, the adhesive layer 265, and the polarizer 210. In addition to copper (Cu), nickel (Ni), silver (Ag), gold (Au) and tin (Sn) or the like is used for the connection line 290. The connection line 290 is formed by a plating method, a coating method or a printing method. For example, in the case when the connection line 290 is formed by a plating method, the connection line 290 may be filled by plating or may be conformally plated. The connection line 300 is formed by the same method as the connection line 290.

In addition to copper (Cu), nickel (Ni), silver (Ag) or the like is used as the lead-out line 320. The lead-out line 320 may be in the form of a film or may be formed by solidifying a film having viscosity. For example, the lead-out line 320 is formed by a printing method. In addition, the lead-out line 320 is processed into a predetermined shape. Furthermore, the connection line 290, the connection line 300, and the lead-out line 320 may be formed before the polarizer 210 and the polarizer 220 are adhered by the adhesive layer 250 and the adhesive layer 260.

Figure 10:
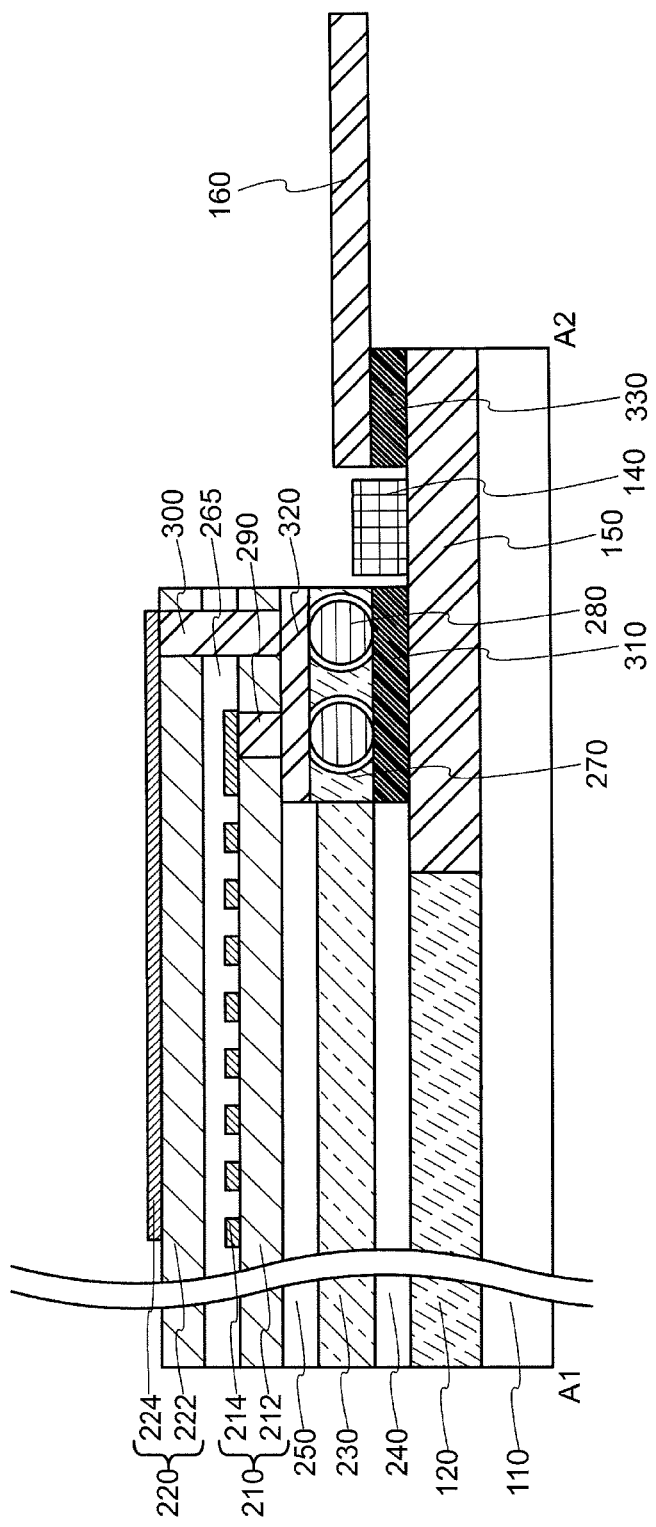
FIG. 10 is a cross-sectional diagram showing a manufacturing method of a display device related to one embodiment of the present invention.

Next, as is shown in FIG. 10, an adhesive layer 270 having conductive particles 280 is formed between the terminal electrode 310 and the lead-out line 320. At the stage where the adhesive layer 270 is formed, the conductive particles 280 are covered with an insulating layer and therefore do not have conductivity. When the conductive particles 280 are bonded by thermocompression, they come in contact with a nearby electrode or other conductive particles 280 whereby an insulating layer on the surface of the conductive particles 280 becomes thin or broken. In this way, the conductive particles 280 have anisotropic conductivity and the terminal electrode 310 and the lead-out line 320 are electrically connected via the conductive particles 280.

Figure 11:
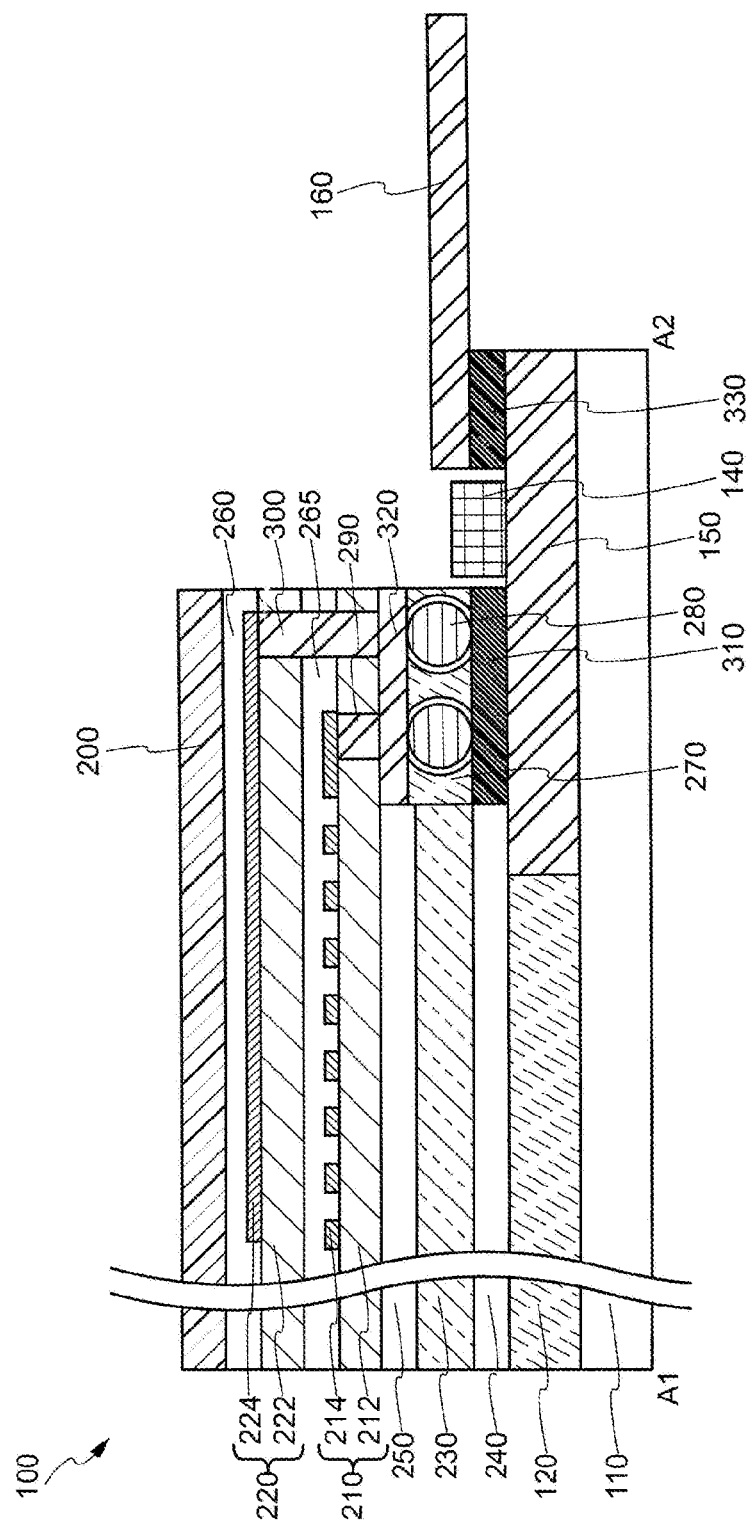
FIG. 11 is a cross-sectional diagram showing a manufacturing method of a display device related to one embodiment of the present invention.

Lastly, as is shown in FIG. 11, a protective member 200 is formed above the polarizer 220 using an adhesive layer 260. The protective member 200 may be a glass substrate or a resin substrate. A material similar to that of the adhesive layer 240 is used for the adhesive layer 260. The display device 100 is manufactured by the above method.

Figure 12:
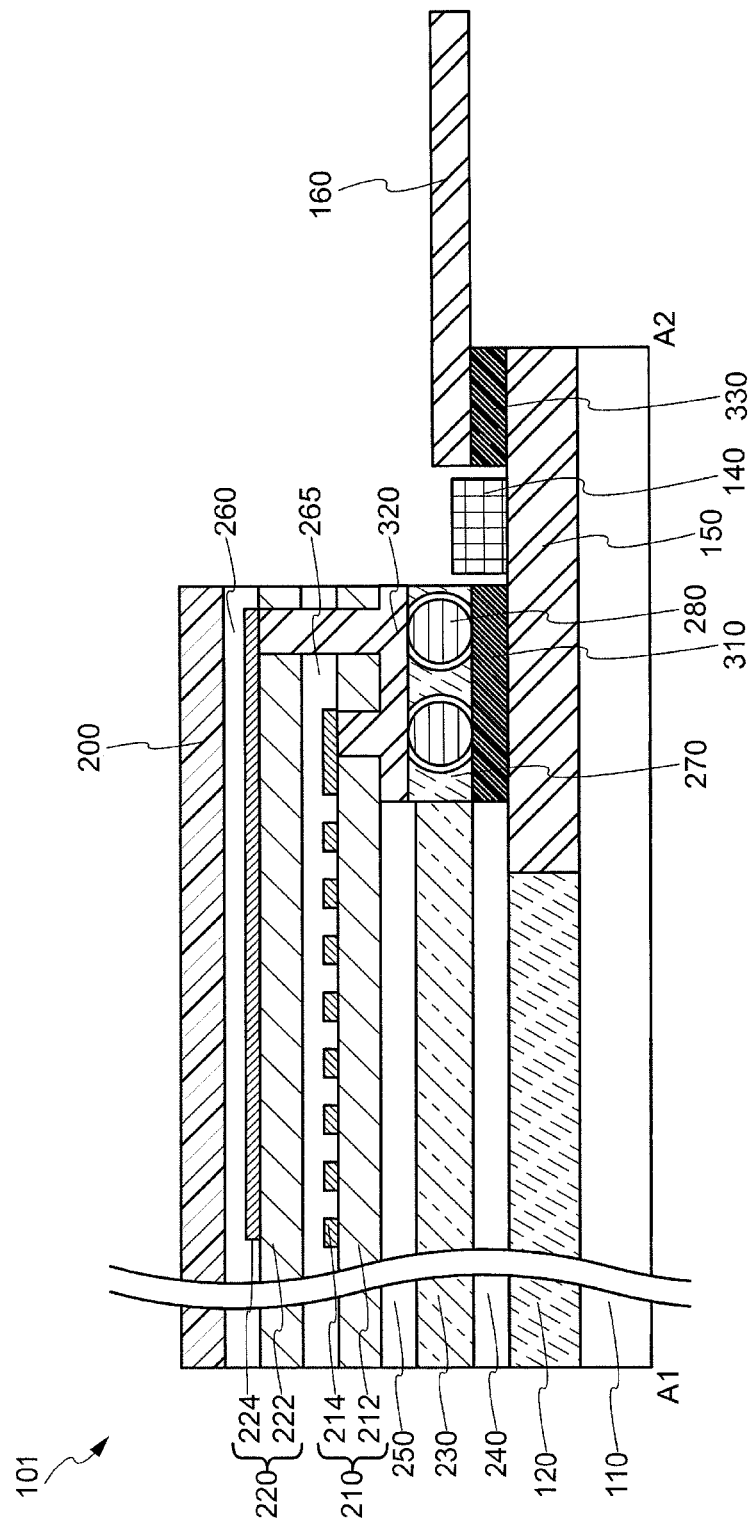
FIG. 12 is a cross-sectional diagram of a display device related to one embodiment of the present invention.

Furthermore, the connection line 290 and the connection line 300 are not necessarily arranged. For example, similar to the display device 101 shown in FIG. 12, the lead-out line 320 and the first wirings 214 and the second wirings 224 may be directly connected. In addition, the lead-out line 320 may be arranged on the same surface of at least one of the first wirings 214 and the second wirings 224.

Figure 13:
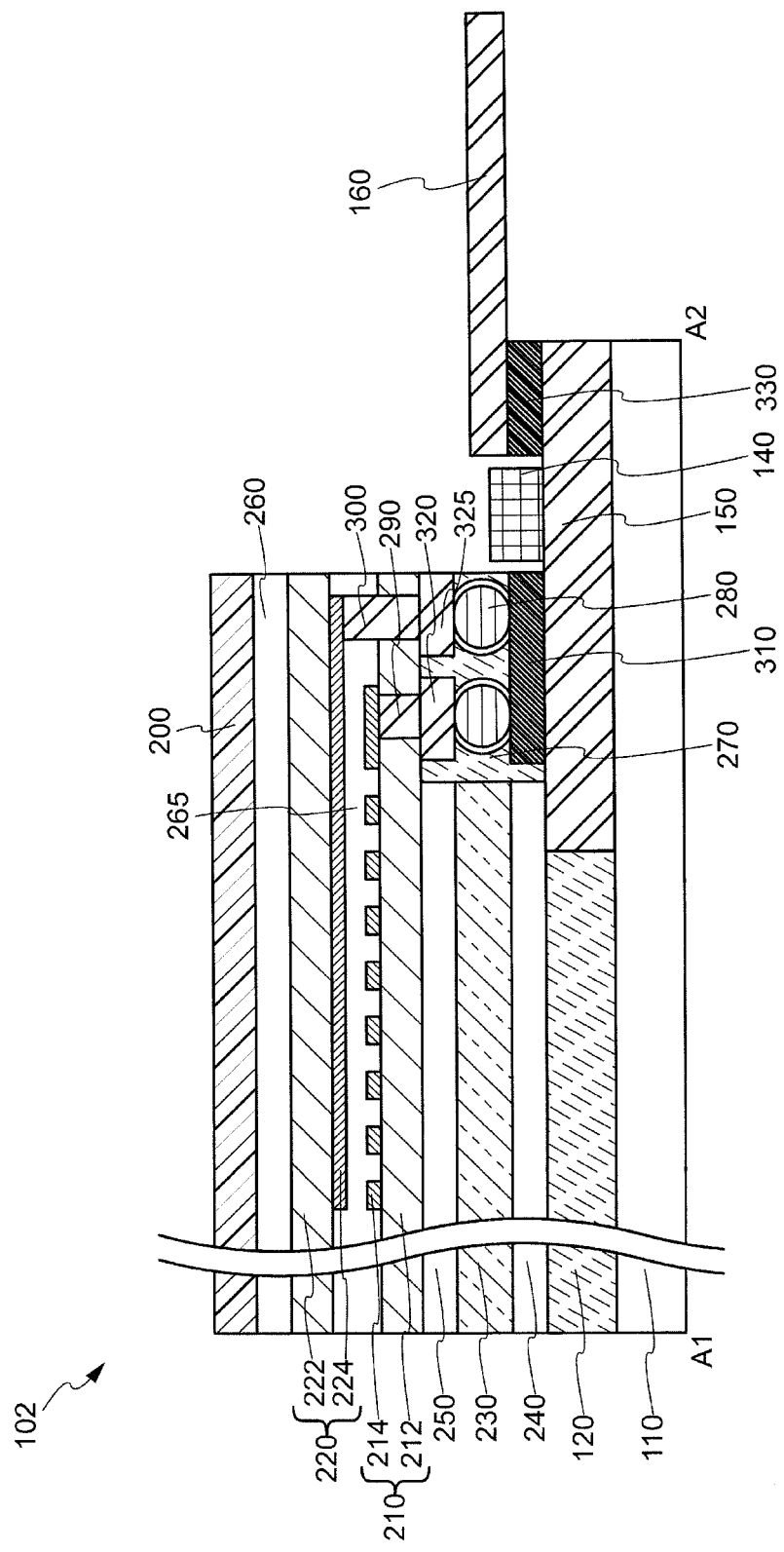
FIG. 13 is a cross-sectional diagram of a display device related to one embodiment of the present invention.

In addition, similar to the display device 102 shown in FIG. 13, the second wirings 224 may be arranged on a lower surface of a base 222, unlike the display device 100. In the display device 100, although the first wirings 214 and the second wirings 224 are connected by the lead-out line 320, they may also be connected so as to have a function as a touch sensor. For example, similar to the display device 102, the first wirings 214 may be connected to the lead-out line 320 and the second wirings 224 may be connected to the lead-out line 325 in the same layer as the lead-out line 320.

Figure 14:
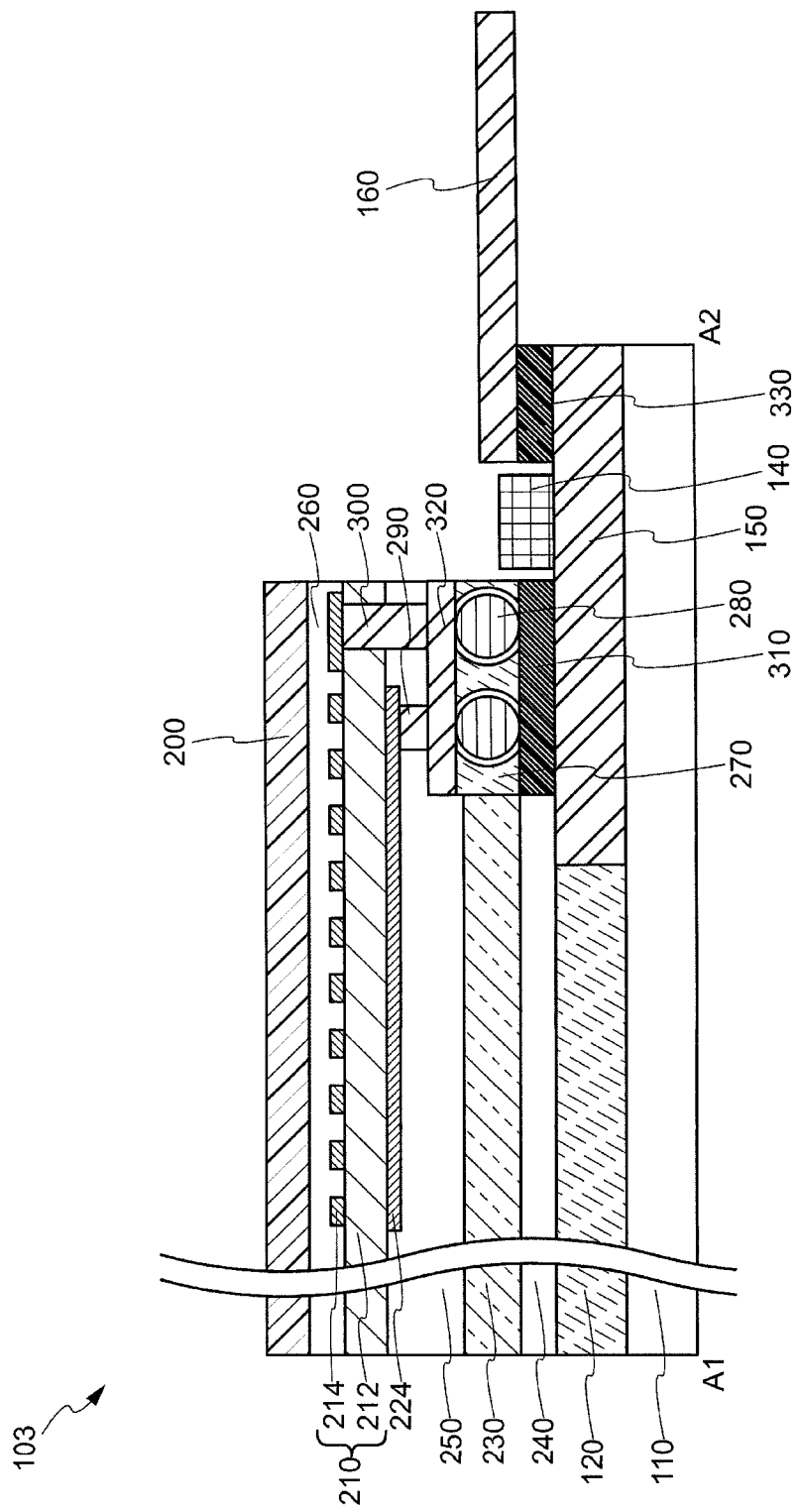
FIG. 14 is a cross-sectional diagram of a display device related to one embodiment of the present invention.

Similar to the display device 103 shown in FIG. 14, the first wirings 214 may be arranged on the upper surface of the base 212 of the polarizer 210, and the first wirings 214 may be arranged on the lower surface of the base 212 without providing the base 222 of the polarizer 220.

Second Embodiment

Next, a display device in which the second wirings 224 is arranged on the retardation plate 230 is explained. Furthermore, an explanation of the structure and materials described in the first embodiment is appropriately referred to.

2-1. Structure of Display Device

Figure 15:
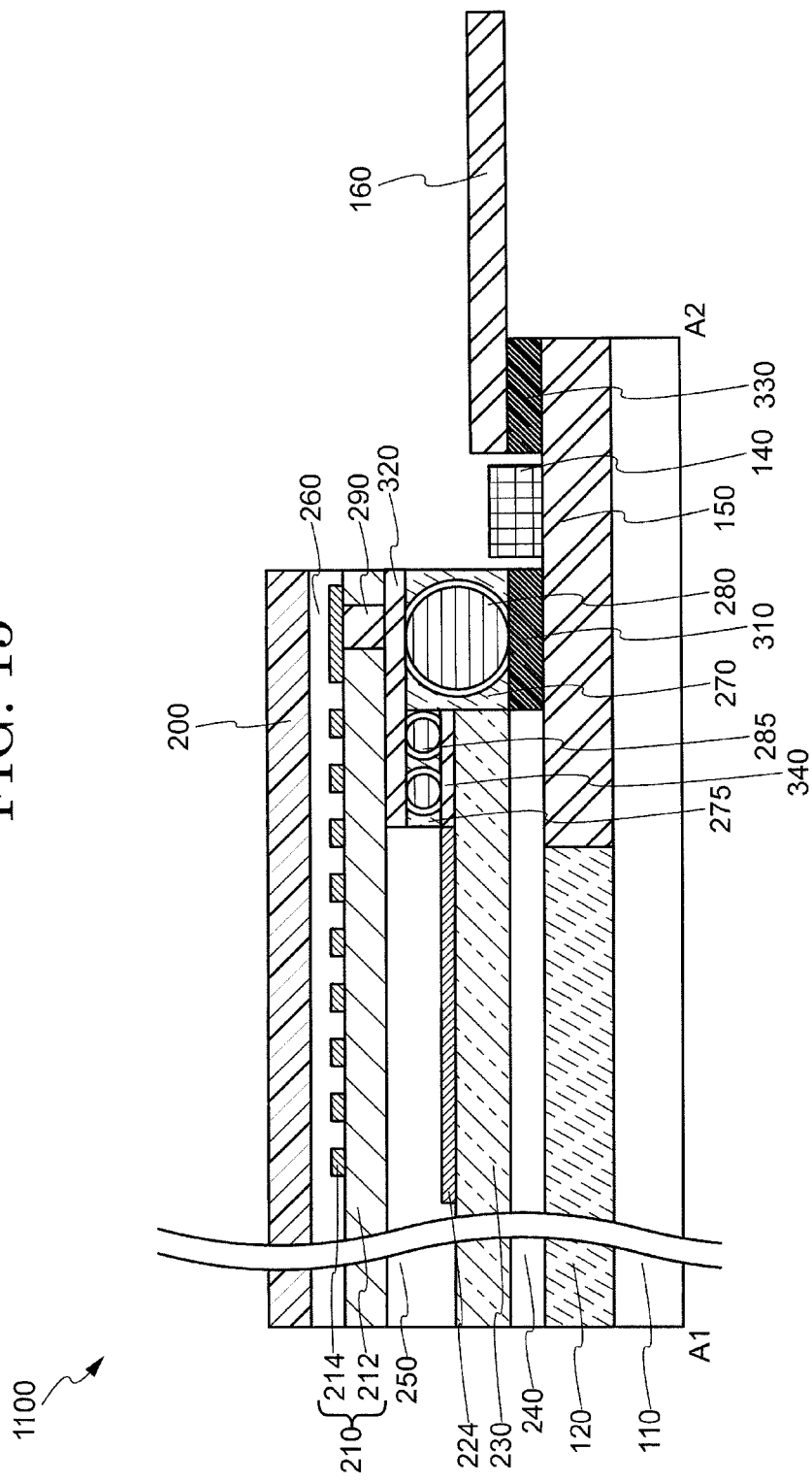
FIG. 15 is a cross-sectional diagram of a display device related to one embodiment of the present invention.

A cross-sectional view of a display device 1100 is shown in FIG. 15. The display device 1100 includes a substrate 110 having a display region 120 and a terminal part 150, an adhesive layer 240, a terminal electrode 310, a retardation plate 230, an adhesive layer 250, an adhesive layer 275, a polarizer 210, an adhesive layer 270, a lead-out line 320, and a lead-out line 340.

The adhesive layer 240 is arranged above the display region 120 and the terminal part 150, and has translucency. The terminal electrode 310 is arranged above the terminal part 150 and is arranged further to the outer side than an end part of the adhesive layer 240, that is, in a region where the adhesive layer 240 is not located. The retardation plate 230 is arranged above the adhesive layer 240 and includes the plurality of second wirings 224 and the lead-out line 340 connected to the plurality of second wirings 224. The adhesive layer 250 is arranged above a part of the retardation plate 230 and has translucency. The adhesive layer 275 is arranged above the lead-out line 340. In addition, the adhesive layer 275 is arranged further to the outer side of an end part of the adhesive layer 250, that is, in a region where the adhesive layer 250 is not located. In addition, the adhesive layer 275 has conductive particles 285. The polarizer 210 is arranged above the adhesive layer 250 and the adhesive layer 275, and has a plurality of first wirings 214, lead-out line 320, and connection line 290 connecting the plurality of first wirings 214 and the lead-out line 320. The adhesive layer 270 is arranged above the terminal part 150 and the terminal electrode 310. The adhesive layer 270 is arranged further to the outer side than an end part of the adhesive layer 240. The adhesive layer 270 includes conductive particles 280. The terminal electrode 310 and the lead-out line 320 are connected via the conductive particles 280. The lead-out line 340 and the lead-out line 320 are connected via the conductive particles 285.

Furthermore, the conductive particles 280 and the conductive particles 285 may have different sizes or may have the same size.

Figure 16:
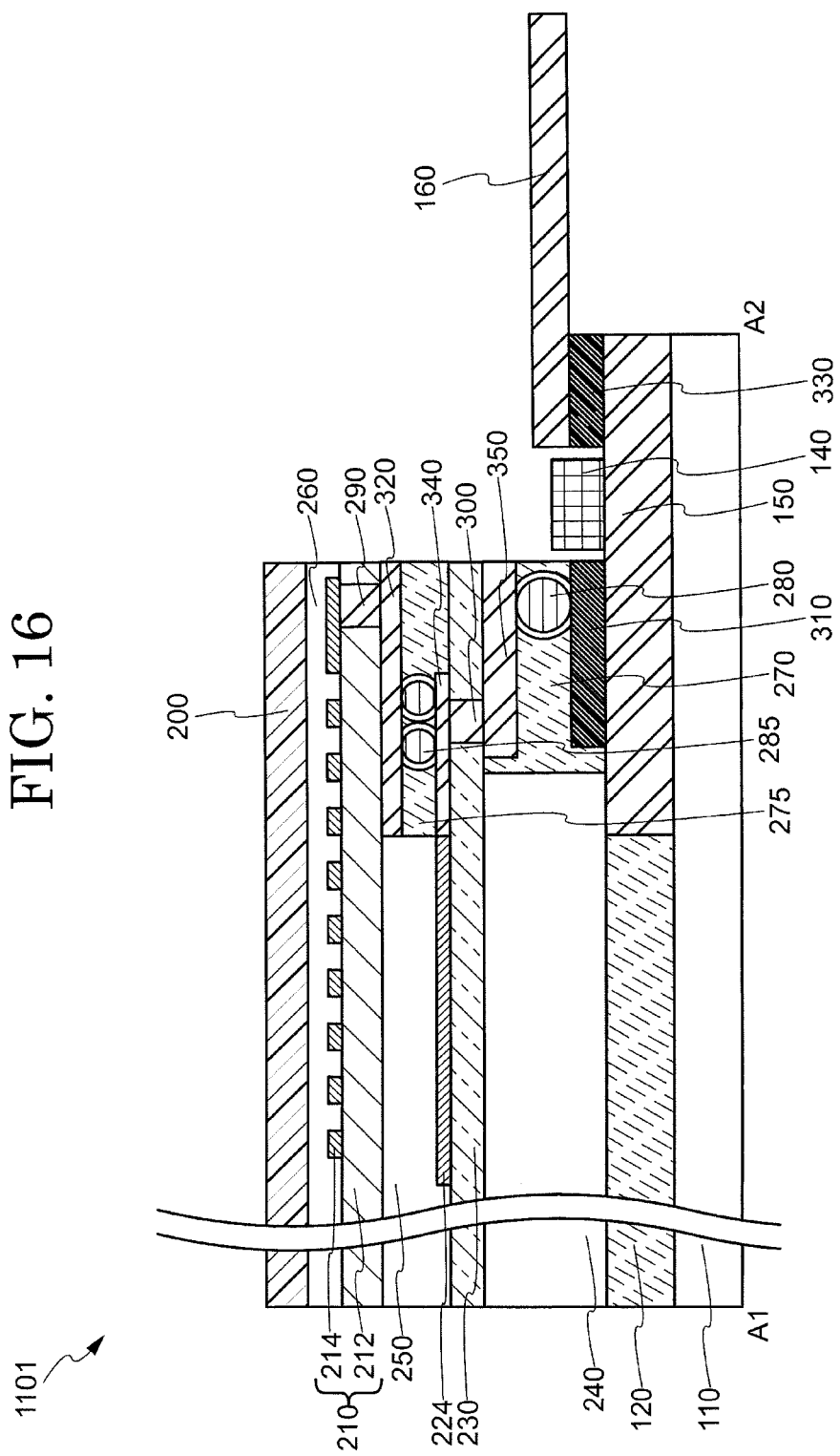
FIG. 16 is a cross-sectional diagram of a display device related to one embodiment of the present invention.

A cross-sectional view of the display device 1101 is shown in FIG. 16. The display device 1101 includes a substrate 110 having a display region 120 and a terminal part 150, an adhesive layer 240, a terminal electrode 310, a retardation plate 230, an adhesive layer 250, an adhesive layer 275, a polarizer 210, and an adhesive layer 270.

The adhesive layer 240 is arranged above the display region 120 and the terminal part 150 and has translucency. The terminal electrode 310 is arranged above the terminal part 150 and is arranged further to the outer side than an end part of the adhesive layer 240, that is, in a region where the adhesive layer 240 is not located. The retardation plate 230 is arranged above the adhesive layer 240 and includes a plurality of second wirings 224, a lead-out line 340 connected to the plurality of second wirings 224, a lead-out line 350 opposing the lead-out line 340 and a connection line 300 connecting the lead-out line 340 and the lead-out line 350. The adhesive layer 250 is arranged in a part of the retardation plate 230 and has translucency. The adhesive layer 275 is arranged above the lead-out line 340. In addition, the adhesive layer 275 is arranged further to the outer side than an end part of the adhesive layer 250, that is, in a region where the adhesive layer 250 is not located. In addition, the adhesive layer 275 includes conductive particles 285. The polarizer 210 is arranged above the adhesive layer 250 and the adhesive layer 275 and includes a lead-out line 320 and a connection line 290 connecting the plurality of first wirings 214 and the lead-out line 320. The adhesive layer 270 is arranged above the terminal electrode 310. In addition, the adhesive layer 270 is arranged further to the outer side than an end part of the adhesive layer 240. The adhesive layer 270 also includes conductive particles 280. The terminal electrode 310 and the lead-out line 320 are connected via the conductive particles 280, the lead-out line 350, the connection line 290, the lead-out line 340 and the conductive particles 285.

In FIG. 16, an end part of the retardation plate 230 located at the terminal part 150 and an end part of the polarizer 210 located at the terminal part 150 match in a planar view. However, in the present embodiment, as shown in FIG. 4, and FIG. 12 to FIG. 15, the end part of the retardation plate 230 located at the terminal part 150 may be located closer to the side of the display region 120 than the end part of the polarizer 210 located at the terminal part 150.

Figure 17:
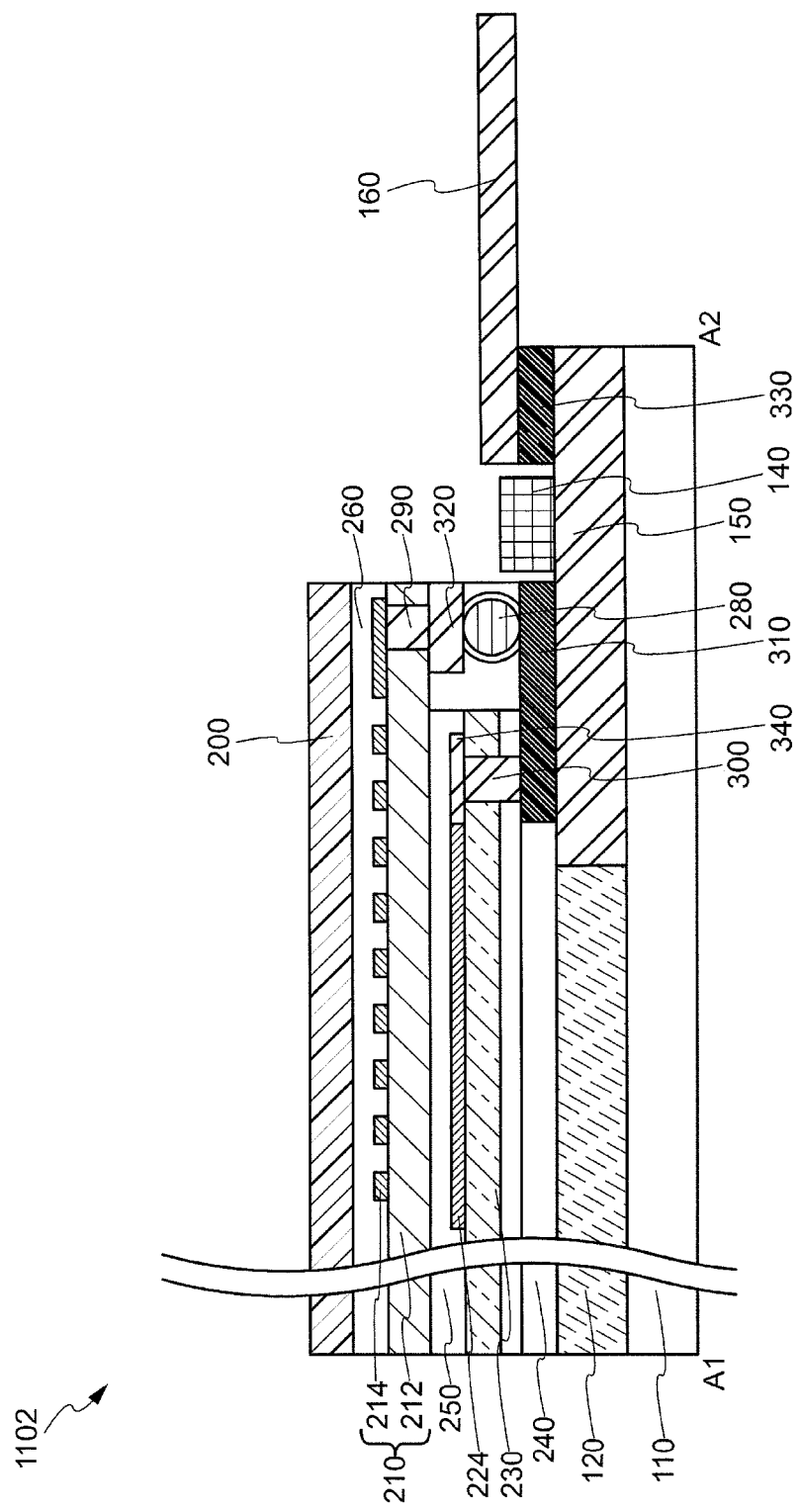
FIG. 17 is a cross-sectional diagram of a display device related to one embodiment of the present invention.

Furthermore, similar to the display device 1102 shown in FIG. 17, the adhesive layer 275 having the conductive particles 285 and the lead-out line 350 are not necessarily arranged. In this case, the terminal electrode 310 and the lead-out line 320 may be connected via the conductive particles 280. In addition, the terminal electrode 310 and the lead-out line 340 may be connected via the retardation plate 230 and the connection line 300 formed in the opening part arranged passing through the adhesive layer 240.

Third Embodiment

Figure 18:
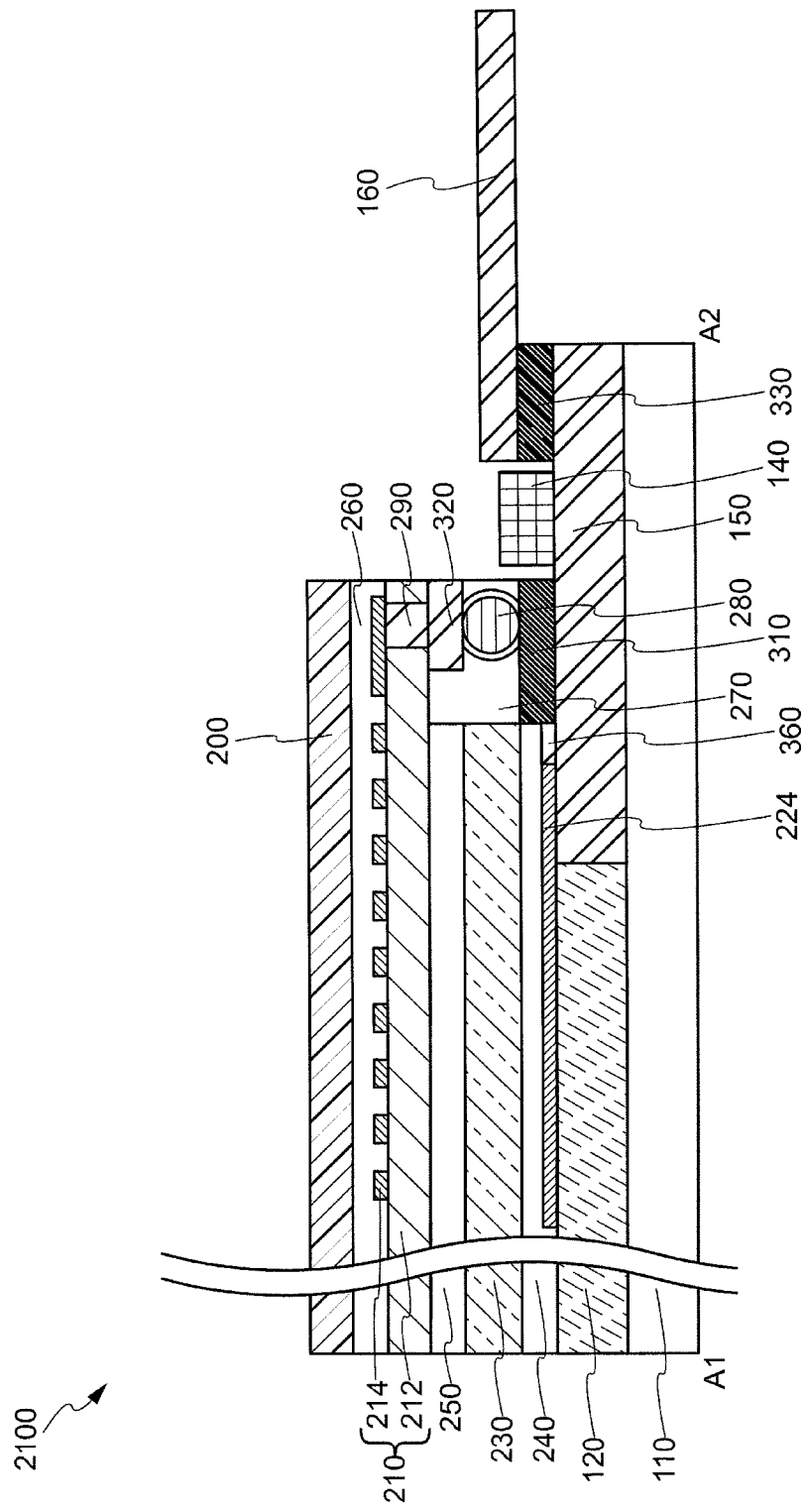
FIG. 18 is a cross-sectional diagram of a display device related to one embodiment of the present invention.

A display device in which second wirings 224 is arranged in the same layer as an opposing electrode opposing a pixel electrode of a display element is explained below. Furthermore, an explanation of the structure and materials described in the first and second embodiments is appropriately referred to.
3-1. Structure of Display Device A cross-sectional view of a display device 2100 is shown in FIG. 18. The display device 2100 includes a substrate 110, a terminal electrode 310, an adhesive layer 240, a retardation plate 230, an adhesive layer 250, a polarizer 210 and an adhesive layer 270.

The substrate 110 includes a display region 120 and a terminal part 150. The plurality of second wirings 224 are arranged in the same layer as an opposing electrode 400 (refer to FIG. 19) opposing a pixel electrode (of each of a plurality of pixels) of a display element arranged in the display region 120. The adhesive layer 240 is arranged above the display region 120 and the terminal part 150 and has translucency. The terminal electrode 310 is arranged above the terminal part 150 and is arranged further to the outer side of an end part of the adhesive layer 240, that is, in a region where the adhesive layer 240 of the terminal part 150 is not located. The retardation plate 230 is arranged above the adhesive layer 240. The adhesive layer 250 is arranged above the retardation plate 230 and has translucency. The polarizer 210 is arranged above the adhesive layer 250. The polarizer 210 includes a lead-out line 320 and a connection line 290 connecting the plurality of first wirings 214 and the lead-out line 320. The adhesive layer 270 is arranged above the terminal electrode 310 and is arranged further to the outer side than an end part of the adhesive layer 240. The adhesive layer 270 includes conductive particles 280. The plurality of second wirings 224 and the terminal electrode 310 are connected via a lead-out line 360. The terminal electrode 310 and the lead-out line 320 are connected via the conductive particles 280.

Figure 19:
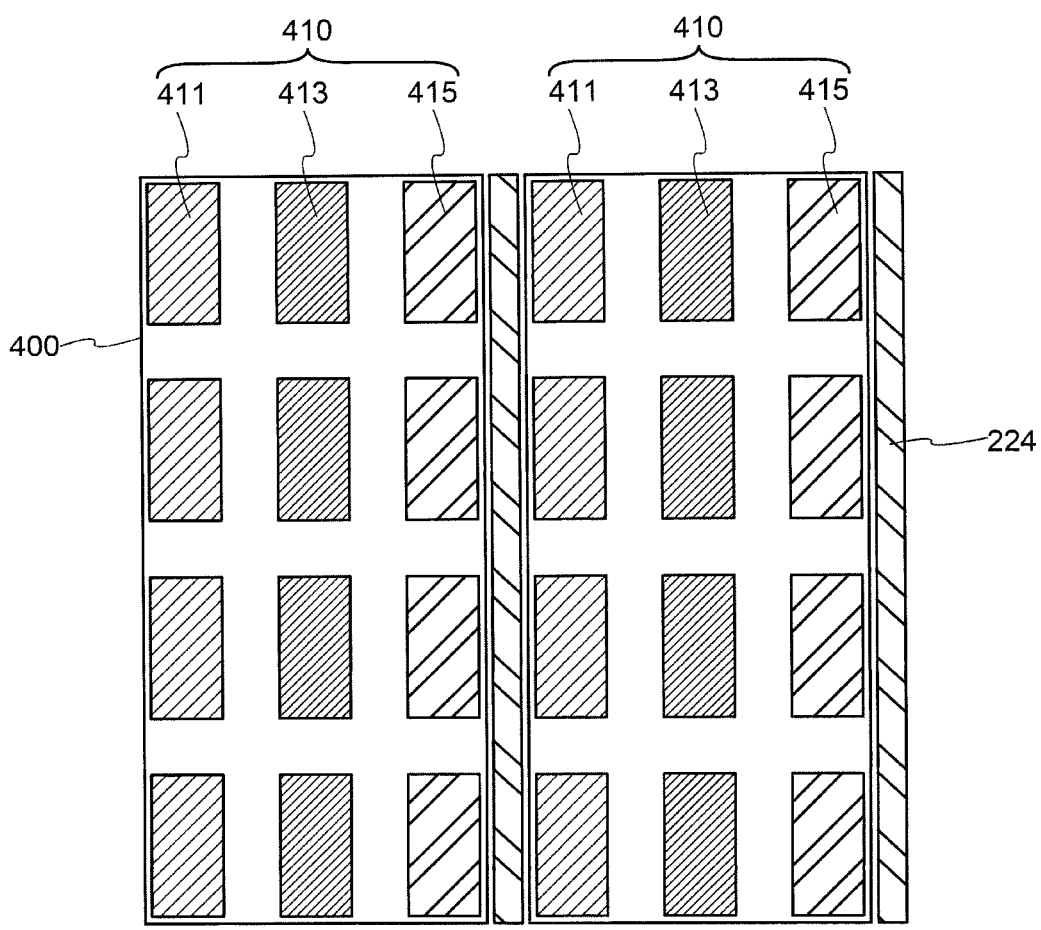
FIG. 19 is an upper surface view diagram of a display device related to one embodiment of the present invention.

An upper surface view showing of an expanded part of the display region 120 of the display device 2100 is shown in FIG. 19. In FIG. 18, the second wirings 224 and the opposing electrode 400 are arranged in the same layer. The opposing electrode 400 is arranged above a plurality of pixels 410 including a sub-pixel 411, a sub-pixel 413 and a sub-pixel 415. The second wirings 224 is arranged extending between the sub-pixels (for example, between the sub-pixel 415 and the sub-pixel 411). A silver magnesium alloy, a transparent oxide containing indium, tin or zinc is used for the second wirings 224 and the opposing electrode 400. The second wirings 224 and the opposing electrode 400 are formed by a vapor deposition method or a printing method. In the case where the second wirings 224 and the opposing electrode 400 are formed by a vapor deposition method, a metal mask matching with the shape of the opposing electrode 400 and the second wirings 224 is used.

Furthermore, the terminal electrode 310, the lead-out line 360 and the second wirings 224 may be arranged in the same layer or may be arranged in another layer. The lead-out line 360 is made of the same material as the lead-out line 320.

As described above, it is possible to provide an organic EL display device capable of electrically connecting to a display region without newly arranging a layer for forming an electrode of a touch sensor and without arranging a flexible printed substrate for a touch sensor.

Modifications

In the above-described embodiments, the present invention is applied to an organic EL display device as an example. The present invention is also applicable to a liquid crystal display device, any other self-light emitting display device, an electronic paper-type display device including an electrophoretic display element or the like, or any other flat panel display device.

A person of ordinary skill in the art would readily conceive various alterations or modifications of the present invention, and such alterations and modifications are construed as being encompassed in the scope of the present invention. For example, the display devices in the above-described embodiments may have an element added thereto, or deleted therefrom, or may be changed in design optionally by a person of ordinary skill in the art. The methods in the above-described embodiments may have a step added thereto, or deleted therefrom, or may be changed in the condition optionally by a person of ordinary skill in the art. Such devices and methods are encompassed in the scope of the present invention as long as including the gist of the present invention.

What is claimed is:
1. A display device comprising:
   a substrate including a display region arranged with a plurality of pixels, and a terminal part located on an outer side of the display region and having a first part and a second part, wherein the first part of the terminal part only overlaps a retardation plate and the second part of the terminal part overlaps a terminal electrode but does not overlap the retardation plate in a planar view;

a polarizer overlapping the display region and the first part of the terminal part and the second part of the terminal part in the planar view, the polarizer arranged with a plurality of first wirings;

the retardation plate overlapping the display region and the first part of the terminal part in a planar view, the retardation plate being located between the plurality of pixels and the polarizer; and a plurality of second wirings arranged in a direction intersecting the direction in which the plurality of first wirings is arranged, wherein an interval where the plurality of first wirings is arranged is narrower than an interval where the plurality of second wirings is arranged;

the plurality of first wirings and the plurality of second wirings are arranged sandwiching a dielectric body;

the plurality of first wirings and the plurality of second wirings are each connected to a plurality of lead-out lines respectively;

an end part of the retardation plate located at the terminal part is located closer to a side of the display region than an end part of eh polarizer located at the terminal part;

the first part of the terminal part is in between the display region and the second part of the terminal part; and a top surface of the retardation plate is lower than a bottom surface of the lead-out line in an area overlapping with the second part of the terminal part.

2. The display device according to claim 1, wherein electrostatic capacitance between the plurality of first wirings and the plurality of second wirings is detected.

3. The display device according to claim 1, wherein one of the plurality of first wirings and the plurality of second wirings is a transmitting electrode and the other is a receiving electrode.

4. The display device according to claim 1, wherein an end part of the plurality of first wirings is electrically connected via a connection part for each of the plurality of first wirings, and the connection part and the lead-out line are electrically connected via a routing line.

5. The display device according to claim 1, wherein the plurality of first wirings and the plurality of second wirings include aluminum or silver.

6. The display device according to claim 5, wherein a width of the first wirings and a width of the second wirings is 10 nm or more and less than 1 μm.

7. The display device according to claim 1, further comprising:

a first adhesive layer having translucency and located above the display region and the terminal part;

a terminal electrode arranged in a region where the first adhesive layer of the terminal part is not located;

the retardation plate above the first adhesive layer;

a second adhesive layer having translucency above the retardation plate;

the polarizer having the plurality of first wirings and a first lead-out line above the second adhesive layer;

a fourth adhesive layer having translucency above the polarizer;

a second polarizer having the plurality of second wirings above the fourth adhesive layer;

a first connection line connecting the plurality of first wirings and the first lead-out line;

a second connection line connecting the plurality of second wirings and the first lead-out line; and a third adhesive layer arranged above the terminal electrode and including conductive particles, wherein the terminal electrode and the first lead-out line are connected via the conductive particles.

8. The display device according to claim 1, further comprising:

a first adhesive layer having translucency and located above the display region and the terminal part;

a terminal electrode arranged in a region where the first adhesive layer of the terminal part is not located;

the retardation plate arranged above the first adhesive layer, and including a first lead-out line connected to the plurality of first wirings and the plurality of second wirings;

a second adhesive layer having translucency arranged in a part above the retardation plate;

a third adhesive layer arranged in a region above the first lead-out line where the second adhesive layer is not located, the third adhesive layer having a first conductive particle;

the polarizer arranged above the second adhesive layer and the third adhesive layer, and including the plurality of first wirings, the second lead-out line, and a first connection line connecting the plurality of first wirings and the second lead-out line; and a fourth adhesive layer arranged above the terminal electrode and including a second conductive particle, wherein the terminal electrode and the second lead-out line are connected via the second conductive particle; and the first lead-out line and the second lead-out line are connected via the first conductive particle.

9. The display device according to claim 8, wherein the first conductive particle and the second conductive particle have different sizes.

10. The display device according to claim 1, further comprising:

a first adhesive layer having translucency and located above the display region and the first part of the terminal part;

a terminal electrode arranged in a region of the terminal part where the first adhesive layer is not located;

the retardation plate arranged above the first adhesive layer, and including the plurality of second wirings, a first lead-out line connected to the plurality of second wirings, a second lead-out line opposing the first lead-out line, and a first connection line connecting the first lead-out line with the second lead-out line;

a second adhesive layer having translucency arranged above a part of the retardation plate;

a third adhesive layer arranged in a region above the first lead-out line where the second adhesive layer is not located, the third adhesive layer having a first conductive particle;

the polarizer arranged above the second adhesive layer and the third adhesive layer, and including a third lead-out line and a second connection line connecting the plurality of first wirings and the third lead-out line; and a fourth adhesive layer arranged above the terminal electrode and including a second conductive particle, wherein the terminal electrode and the third lead-out line are connected via the second conductive particle, the second lead-out line, the first connection line, the first lead-out line and the first conductive particle.

11. The display device according to claim 1, further comprising:
a pixel electrode arranged in each of the plurality of pixels;
an opposing electrode opposing the pixel electrode;
the plurality of second wirings arranged in the same layer as the opposing electrode:
a first adhesive layer having translucency and located above the display region and the first part of the terminal part;
a terminal electrode arranged in a region of the terminal part where the first adhesive layer is not located;
the retardation plate above the first adhesive layer;
a second adhesive layer having translucency above the retardation plate;
the polarizer arranged above the second adhesive layer and including a second lead-out line and a connection line connecting the plurality of first wirings and the second lead-out line; and
a third adhesive layer arranged above the terminal electrode and including a conductive particle;
wherein
the plurality of second wirings and the terminal electrode are connected via the first lead-out line; and
the terminal electrode and the second lead-out line are connected via the conductive particle.

12. The display device according to claim 7, wherein the conductive particle includes an insulation layer at a periphery part of a core part having conductivity.

13. A display device comprising:
a substrate including a display region arranged with a plurality of pixels, and a terminal part located on an outer side of the display region and having a first part and a second part, wherein the first part of the terminal part only overlaps a retardation plate and the second part of the terminal part overlaps a terminal electrode but does not overlap the retardation plate in a planar view;
a first adhesive layer having translucency located above the display region and the first part of the terminal part and the second part of the terminal part;
the terminal electrode arranged in a region of the terminal part where the first adhesive layer is not located;
a polarizer overlapping the display region and the first part of the terminal part in the planar view, the polarizer arranged with a plurality of first wirings; and
a retardation plate overlapping the display region and the first part of the terminal part in a planar view, the retardation plate being located between the plurality of pixels and the polarizer, and arranged with a plurality of second wirings arranged in a direction intersecting the direction in which the plurality of first wirings is arranged, wherein
the retardation plate includes a first lead-out line connected to the plurality of second wirings, a second lead-out line opposing the first lead-out line, a first connection line connecting the first lead-out line and the second lead-out line;
a second adhesive layer having translucency arranged in a part above the retardation plate;
a third adhesive layer having a first conductive particle and arranged in a region where the second adhesive layer is not located above the first lead-out line;
a fourth adhesive layer overlapping with the second part of the terminal part having a second conductive particle and arranged above the terminal electrode;
the polarizer is located above the second adhesive layer and the third adhesive layer, and includes a third lead-out line and a second connection line connecting the plurality of first wirings and the third lead-out line; and
the terminal electrode and the third lead-out line are connected via the second conductive particle, the second lead-out line, the second connection line, the first lead-out line and the first conductive particle:
the first part of the terminal part is in between the display region and the second part of the terminal part; and
a top surface of the retardation plate is lower than a bottom surface of the lead-out line in an area overlapping with the second part of the terminal part.

14. The display device according to claim 13, wherein an interval where the plurality of first wirings is arranged is narrower than an interval where the plurality of second wirings is arranged.

15. The display device according to claim 1, wherein each of the plurality of pixels includes an organic EL element.

16. The display device according to claim 1, wherein
the polarizer has a first contact hole; and
the plurality of first wrings connect with the lead-out line through the first contact hole.

17. The display device according to claim 7, wherein
the polarizer has a first contact hole;
the second polarizer has a second contact hole;
the first connection line is in the first contact hole; and
the second connection line is in the second contact hole.

18. The display device according to claim 13, wherein
the polarizer has a first contact hole; and
the plurality of first wrings connect with the lead-out line through the first contact hole.

* * * * *